(12) United States Patent
Sato et al.

(10) Patent No.: US 9,343,380 B2
(45) Date of Patent: May 17, 2016

(54) HIGH-FREQUENCY POWER AMPLIFIER AND METHOD FOR MANUFACTURING THE SAME

(71) Applicant: Mitsubishi Electric Corporation, Tokyo (JP)

(72) Inventors: Kunihiro Sato, Tokyo (JP); Shin Chaki, Tokyo (JP); Takashi Yamasaki, Tokyo (JP); Takaaki Yoshioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/535,475

(22) Filed: Nov. 7, 2014

(65) Prior Publication Data

US 2015/0236649 A1    Aug. 20, 2015

(30) Foreign Application Priority Data

Feb. 17, 2014    (JP) .................................. 2014-027810

(51) Int. Cl.
| | | |
|---|---|---|
| *G01R 19/00* | (2006.01) | |
| *H03F 3/68* | (2006.01) | |
| *H01L 21/66* | (2006.01) | |
| *H03F 3/19* | (2006.01) | |
| *H03F 3/24* | (2006.01) | |

(52) U.S. Cl.
CPC ................. *H01L 22/14* (2013.01); *H01L 22/32* (2013.01); *H03F 3/19* (2013.01); *H03F 3/24* (2013.01); *H03F 2200/451* (2013.01)

(58) Field of Classification Search
CPC ......... H03F 1/0205; H03F 3/19; H03F 3/211; H03F 2200/451; G01R 31/2831; G01R 31/2855; G01R 31/2642; G01R 31/2849; G01R 31/318577; G01R 1/06772; G01R 27/32; G01R 33/3614
USPC ........... 330/2, 84, 124 R, 126, 148, 295, 307; 324/72.5, 73.1, 123, 757.03, 762.05; 340/653, 596
See application file for complete search history.

(56) References Cited

U.S. PATENT DOCUMENTS 5,834,975 A * 11/1998 Bartlett ................... H03F 3/211
                                                      330/278

(Continued)

FOREIGN PATENT DOCUMENTS

| | | |
|---|---|---|
| JP | 1-173761 A | 7/1989 |
| JP | 2010-263566 A | 11/2010 |

OTHER PUBLICATIONS

Korean Patent Office; Office Action in Korean Patent Application No. 10-2015-0016446 (Dec. 14, 2015).

*Primary Examiner* — Steven J Mottola
*Assistant Examiner* — Hafizur Rahman
(74) *Attorney, Agent, or Firm* — Leydig, Voit & Mayer, Ltd.

(57) ABSTRACT

A high-frequency power amplifier includes: a semiconductor substrate; transistor cells separated from each other and located on the semiconductor substrate; and testing electrodes respectively connected to individual transistor cells, wherein an electrical signal and power to individually operate each corresponding transistor cell are supplied to each transistor cell, independently, from outside, using the testing electrodes.

6 Claims, 2 Drawing Sheets

(56) References Cited

U.S. PATENT DOCUMENTS

| | | | | |
|---|---|---|---|---|
| 5,872,481 A | * | 2/1999 | Sevic | H03F 1/0277 330/124 R |
| 2010/0283474 A1 | | 11/2010 | Fukuda et al. | |
| 2014/0266460 A1 | * | 9/2014 | Nobbe | H03F 1/0261 330/295 |
| 2015/0137845 A1 | * | 5/2015 | Olson | H03F 1/56 324/754.03 |

* cited by examiner

TRANSISTOR OPERATION LOAD LINE

OPERATION LOAD POINT ON IMPEDANCE CHART

HIGH-FREQUENCY POWER AMPLIFIER AND METHOD FOR MANUFACTURING THE SAME

BACKGROUND OF THE INVENTION

1. Field of the Invention

The present invention relates to a high-frequency power amplifier and method for manufacturing the same which can conduct the high-frequency burn-in test efficiently.

2. Background Art

In a high-frequency burn-in test, by using equipment (DC power supply, RF stress signal generator, and RF load adjusting equipment such as a tuner) which is mounted on a burn-in device and can adjust an electric stress, a DC stress signal or an RF stress signal is applied to a transistor cell of a high-frequency power amplifier. Conventionally, a high-frequency burn-in test was conducted by applying a stress signal simultaneously to a plurality of the transistor cells connected in parallel (see Japanese Patent Laid-Open No. 01-173761, for example).

SUMMARY OF THE INVENTION

Application of the RF stress signal rather than the DC stress signal can give a stress to a transistor cell in a wider operation region, and a stress effect is greater. However, when a burn-in test is to be conducted by simultaneously operating a plurality of the transistor cells included in the high-frequency power amplifier which is a final product, the transistor cells need to be operated by frequencies and power according to the individual final products. Particularly, a device for high-frequency burn-in testing for a high-frequency power amplifier with a high frequency and large power is expensive, and maintenance management of the device is difficult.

In view of the above-described problems, an object of the present invention is to provide a high-frequency power amplifier and method for manufacturing the same which can conduct the high-frequency burn-in test efficiently.

According to the present invention, a high-frequency power amplifier includes: a semiconductor substrate; a plurality of transistor cells separated to each other and provided on the semiconductor substrate; and a plurality of testing electrodes connected to the plurality of transistor cells respectively and individually, wherein an electrical signal and power for individually operating the corresponding transistor cell are supplied to each of the transistor cells independently from an outside by the testing electrodes.

In the present invention, a plurality of testing electrodes are connected to the plurality of transistor cells respectively and individually, and an electrical signal and power for individually operating the corresponding transistor cell are supplied to each of the transistor cells independently from an outside by the testing electrodes. Therefore, the high-frequency burn-in test can be conducted efficiently.

Other and further objects, features and advantages of the invention will appear more fully from the following description.

BRIEF DESCRIPTION OF THE DRAWINGS

FIG. 2 are diagrams for explaining an operation of the high-frequency power amplifier at burn-in.

DETAILED DESCRIPTION OF THE PREFERRED EMBODIMENTS

A high-frequency power amplifier and method for manufacturing the same according to the embodiments of the present invention will be described with reference to the drawings. The same components will be denoted by the same symbols, and the repeated description thereof may be omitted.

Embodiment 1

Figure 1:
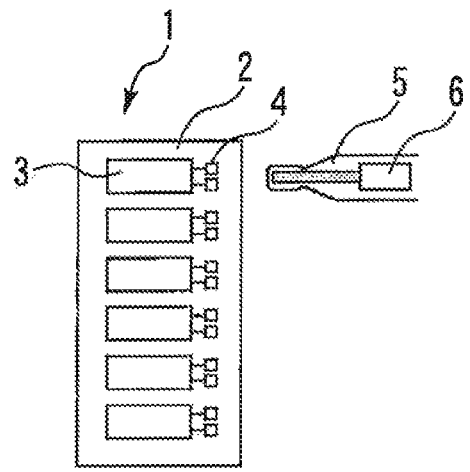
FIG. 1 is a plan view illustrating a high-frequency power amplifier according to Embodiment 1 of the present invention.

FIG. 1 is a plan view illustrating a high-frequency power amplifier according to Embodiment 1 of the present invention. A plurality of transistor cells 3 are separated to each other and provided individually on a semiconductor substrate 2 of a high-frequency power amplifier 1. A plurality of testing electrodes 4 are connected to the plurality of transistor cells 3, respectively and individually. An electrical signal and power for individually operating the corresponding transistor cells 3 are supplied to each of the transistor cells 3 independently from an outside by the testing electrodes 4.

A manufacturing method of this high-frequency power amplifier 1 will be explained. First, the plurality of transistor cells 3 are separated to each other and formed on the semiconductor substrate 2. Subsequently, the plurality of testing electrodes 4 connected individually to the plurality of transistor cells 3, respectively, are formed.

Subsequently, an RF probe 5 in a chip (wafer) state is brought into contact with one of the plurality of testing electrodes 4, and an electrical signal (a DC stress signal or an RF stress signal) and power are independently supplied from the outside to the corresponding transistor cells 3, and a high-frequency burn-in test is conducted. In the RF probe 5, a load circuit 6 corresponding to the RF stress signal is provided.

Figure 2:
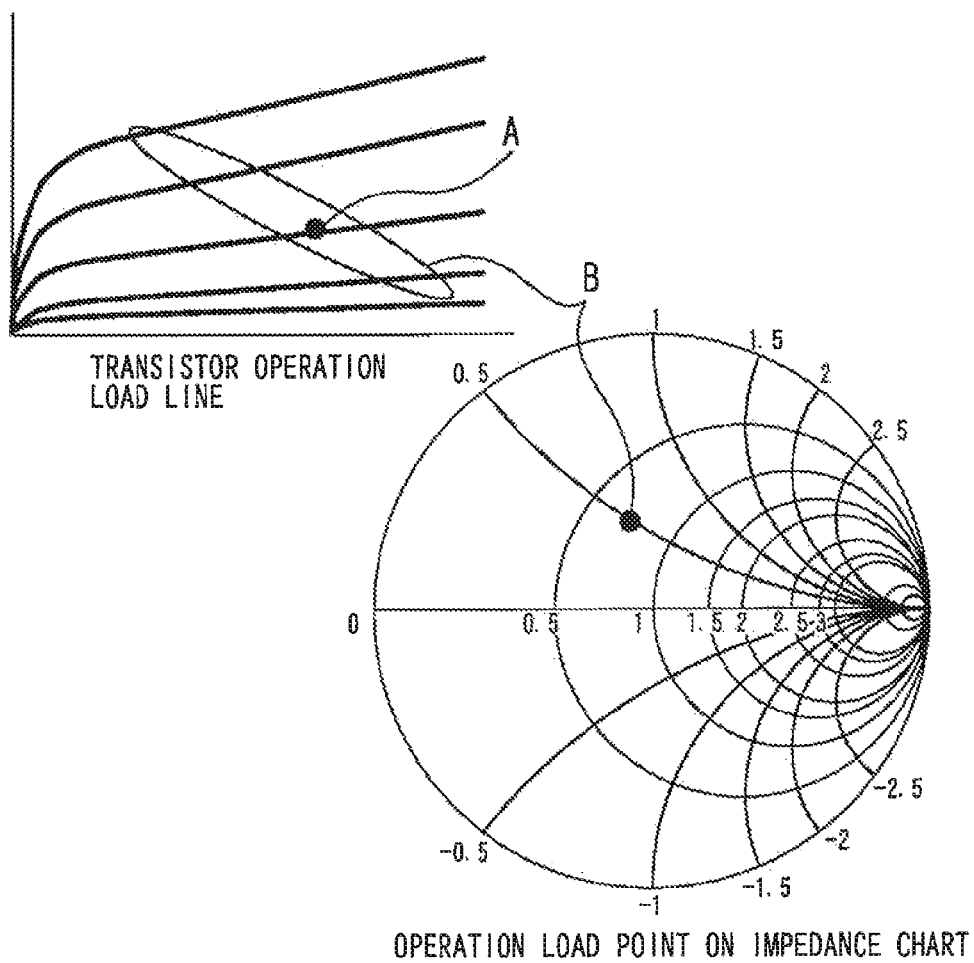

FIG. 2 are diagrams for explaining an operation of the high-frequency power amplifier at burn-in. In the figure, a point A is a stress point by the DC stress signal. A point B is a stress range by the RF stress signal. In the high-frequency burn-in test, by applying a stress by the DC stress signal indicated by the point A and by further applying the RF stress signal indicated by the point B, deterioration of a fragile portion of the transistor cell 3 is accelerated, and the transistor cell 3 which will deteriorate is detected.

In this embodiment, the plurality of testing electrodes 4 connected individually to the plurality of transistor cells 3, respectively, are provided. Thus, the frequency and load of the RF stress signal can be freely selected for each of the transistor cells 3 to be tested. Therefore, the DC stress signal and the RF stress signal can be made required minimum power signals to apply a stress to one transistor cell 3, and thus, a stress effect can be obtained with a smaller power signal without depending on the frequency and power of the final product. Moreover, a stress condition can be made common without depending on the frequency and power of the final product. As a result, the high-frequency burn-in test can be conducted efficiently.

Embodiment 2

Figure 3:
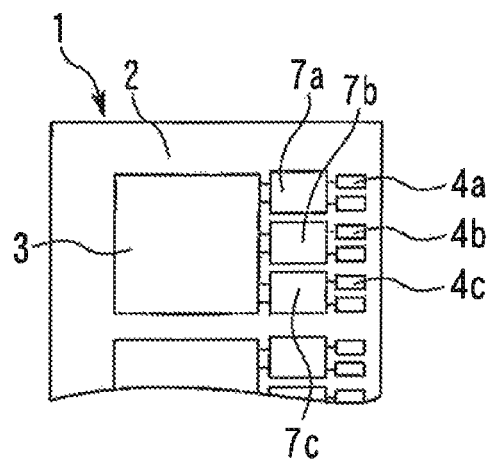
FIG. 3 is a plan view illustrating a high-frequency power amplifier according to Embodiment 2 of the present invention.

FIG. 3 is a plan view illustrating a high-frequency power amplifier according to Embodiment 2 of the present invention. As the testing electrode 4, a plurality of electrodes 4a, 4b, and 4c are connected to each of the transistor cells 3. A plurality of load circuits 7a, 7b, and 7c having different loads are connected between the transistor cell 3 and the plurality of electrodes 4a, 4b, and 4c, respectively. As a result, a type of a stress can be used selectively in accordance with the purpose at RF probing. For example, the load circuit 7a, 7b, or 7c having a load according to the frequency of the RF stress signal can be selected. Moreover, a bias voltage of the transistor cell 3 can be set by a resistance value of the load circuit 7a, 7b or 7c.

By using a signal with a higher frequency as the RF stress signal, sizes of the load circuits 7a, 7b, and 7c can be reduced. Moreover, if the load circuits 7a, 7b, and 7c are resistors, by selecting the resistance value so as to become a desired DC bias point, a desired DC stress signal can be applied without depending on a function of an external DC power supply.

Embodiment 3

Figure 4:
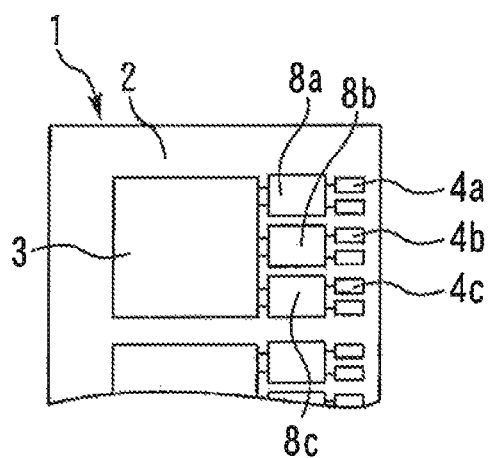
FIG. 4 is a plan view illustrating a high-frequency power amplifier according to Embodiment 3 of the present invention.

FIG. 4 is a plan view illustrating a high-frequency power amplifier according to Embodiment 3 of the present invention. Resistors 8a, 8b, and 8c connected between the transistor cell 3 and the corresponding testing electrodes 4a, 4b, and 4c are formed. In the high-frequency burn-in test, a condition of the electrical signal is adjusted while a change of resistance values of the resistors 8a, 8b, and 8c are measured by a temperature monitor. As a result, a condition of the DCRF stress signals can be adjusted easily during the test.

Embodiment 4

Figure 5:
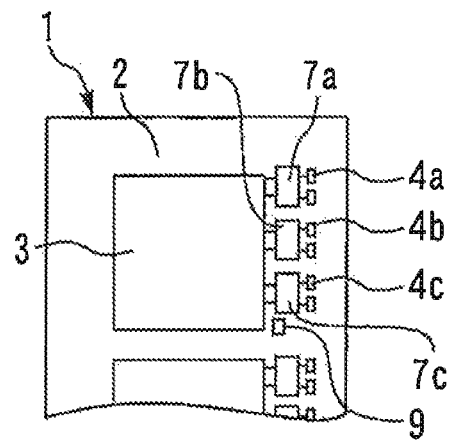
FIG. 5 is a plan view illustrating a high-frequency power amplifier according to Embodiment 4 of the present invention.

FIG. 5 is a plan view illustrating a high-frequency power amplifier according to Embodiment 4 of the present invention. A black body 9 irradiating infrared light to each of the transistor cells 3 is formed. During the high-frequency burn-in test, the condition of the electrical signal is adjusted while a temperature of the black body, that is, a temperature of the transistor cell 3 is measured by the temperature monitor. As a result, the condition of the DCRF stress signal can be adjusted easily during the test.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-027810, filed on Feb. 17, 2014, including specification, claims, drawings and summary, on which the Convention priority of the present application is based, is incorporated herein by reference in its entirety.

What is claimed is:

1. A high-frequency power amplifier comprising:
    a semiconductor substrate;
    a plurality of transistor cells separated from each other and located on the semiconductor substrate; and
    a plurality of testing electrodes located on the semiconductor substrate, wherein respective testing electrodes of the plurality of testing electrodes are only connected to respective corresponding transistor cells of the plurality of transistor cells so that an electrical signal and power for operating each respective corresponding transistor cell can be supplied to each respective corresponding transistor cell individually, from outside the respective corresponding transistor cell, using the testing electrode connected to the respective corresponding transistor cell, without applying the electrical signal and power to any other transistor cell of the plurality of transistor cells.

2. The high-frequency power amplifier according to claim 1, further comprising a plurality of load circuits, wherein a respective load circuit is connected between the respective corresponding transistor cell and the testing electrode connected to the respective corresponding transistor cell.

3. The high-frequency power amplifier according to claim 2, wherein
    a plurality of the testing electrodes are connected to the respective corresponding transistor cell,
    the respective load circuits of the plurality of load circuits have different, respective loads, and
    respective load circuits are connected between the respective, corresponding transistor cell and the plurality of testing electrodes that are connected to the respective corresponding transistor cell.

4. A method for manufacturing a high-frequency power amplifier comprising:
    forming a plurality of transistor cells, separated from each other, on a semiconductor substrate;
    forming a plurality of testing electrodes on the semiconductor substrate with at least one respective testing electrode, of the plurality of testing electrodes, connected to a respective corresponding transistor cell of the plurality of transistor cells; and
    supplying an electrical signal and power, from outside the respective corresponding transistor cell, to the respective corresponding transistor cell using one of the testing electrodes that is connected to the respective corresponding transistor cell and conducting a high-frequency burn-in test of the respective corresponding transistor cell individually, without applying the electrical signal and power to any other transistor cell of the plurality of transistor cells.

5. The method according to claim 4, further comprising:
    forming a plurality of resistors on the semiconductor substrate, with a respective resistor connected between each respective corresponding transistor cell and one of the testing electrodes connected to the respective corresponding transistor cell; and
    in the high-frequency burn-in test, adjusting the electrical signal and measuring a change of resistance of the resistor connected to the respective corresponding transistor cell being subjected to the high-frequency burn-in test using a temperature monitor.

6. The method according to claim 4, further comprising:
    forming a plurality of black bodies on the semiconductor substrate, with a respective black body located proximate a respective corresponding transistor cell and radiating infrared light; and
    in the high-frequency burn-in test of the respective corresponding transistor cell, adjusting the electrical signal and measuring temperature of the respective black body located proximate the respective corresponding transistor cell being subjected to the high-frequency burn-in test using a temperature monitor.

* * * * *